(12) United States Patent
Taniguchi et al.

(10) Patent No.: US 9,447,272 B2
(45) Date of Patent: *Sep. 20, 2016

(54) SOLAR CELL SEALING MATERIAL, AND SOLAR CELL MODULE PREPARED BY USING SAME

(75) Inventors: Kouichirou Taniguchi, Shiga (JP); Michiko Otsuka, Shiga (JP); Jun Nishioka, Shiga (JP)

(73) Assignee: DAI NIPPON PRINTING CO., LTD, Tokyo (JP)

( * ) Notice: Subject to any disclaimer, the term of this patent is extended or adjusted under 35 U.S.C. 154(b) by 714 days.

This patent is subject to a terminal disclaimer.

(21) Appl. No.: 13/812,378

(22) PCT Filed: Jul. 28, 2011

(86) PCT No.: PCT/JP2011/067226
§ 371 (c)(1),
(2), (4) Date: Jan. 25, 2013

(87) PCT Pub. No.: WO2012/014965
PCT Pub. Date: Feb. 2, 2012

(65) Prior Publication Data
US 2013/0118584 A1 May 16, 2013

(30) Foreign Application Priority Data
Jul. 28, 2010 (JP) .................................. 2010-169831

(51) Int. Cl.
*H01L 31/0203* (2014.01)
*C08L 53/00* (2006.01)
(Continued)

(52) U.S. Cl.
CPC ................ *C08L 53/00* (2013.01); *C08L 23/02* (2013.01); *C09K 3/10* (2013.01); *H01L 31/0481* (2013.01);
(Continued)

(58) Field of Classification Search
CPC .. H01L 31/048; H01L 31/0481; C08L 23/10; C08L 2207/12; C08L 2666/06

USPC ......................................................... 136/259
See application file for complete search history.

(56) References Cited

U.S. PATENT DOCUMENTS 6,077,907 A * 6/2000 Raetzsch et al. ............. 525/191
2002/0038664 A1 4/2002 Zenko et al.
(Continued)

FOREIGN PATENT DOCUMENTS

CN 101138095 A 3/2008
CN 101490168 A 7/2009
(Continued)

OTHER PUBLICATIONS

Quijada et al., Copolymerization of Ethylene with 1-hexene and 1-octene Correltion Between Type of Catalyst and Comonomer, Macromolecule Chemistry Physics, vol./Issue 196, pp. 3991-4000 (1995).*

(Continued)

*Primary Examiner* — Jayne Mershon
(74) *Attorney, Agent, or Firm* — Oblon, McClelland, Maier & Neustadt, L.L.P.

(57) ABSTRACT

Provided are a solar cell encapsulant material which facilitates production of solar cell modules, which does not require a crosslinking step and which is excellent in heat resistance and others, and a solar cell module produced by the use of the encapsulant material. The solar cell encapsulant material comprises a resin composition (C) that contains an olefin-based polymer (A) satisfying the following requirement (a) and an olefin-based polymer (B) satisfying the following requirement (b). (a) The crystal melting peak temperature of the polymer, as measured at a heating rate of 10° C./min in differential scanning calorimetry, is lower than 100° C. (b) The extrapolated onset temperature of melting of the polymer, as measured at a heating rate of 10° C./min in differential scanning calorimetry, is 100° C. or higher.

14 Claims, 1 Drawing Sheet

(51) Int. Cl.
*C08L 23/02* (2006.01)
*H01L 31/048* (2014.01)
*C09K 3/10* (2006.01)
*C08L 23/08* (2006.01)
*C08K 5/5425* (2006.01)
*B32B 15/085* (2006.01)
*B32B 27/08* (2006.01)
*B32B 27/32* (2006.01)
*B32B 27/36* (2006.01)

(52) U.S. Cl.
CPC ............. *B32B 15/085* (2013.01); *B32B 27/08* (2013.01); *B32B 27/32* (2013.01); *B32B 27/36* (2013.01); *B32B 2457/12* (2013.01); *C08K 5/5425* (2013.01); *C08L 23/0807* (2013.01); *C08L 23/0815* (2013.01); *C08L 2205/02* (2013.01); *C09K 2200/062* (2013.01); *C09K 2200/0617* (2013.01); *Y02E 10/50* (2013.01); *Y10T 428/24942* (2015.01)

(56) References Cited

U.S. PATENT DOCUMENTS

| | | | |
|---|---|---|---|
| 2006/0199930 A1* | 9/2006 | Li Pi Shan et al. | 526/346 |
| 2007/0267059 A1* | 11/2007 | Nishijima et al. | 136/256 |
| 2008/0108757 A1 | 5/2008 | Hoya et al. | |
| 2008/0115825 A1* | 5/2008 | Patel et al. | 136/252 |
| 2009/0120489 A1 | 5/2009 | Nishijima et al. | |
| 2010/0000600 A1* | 1/2010 | Hoya | 136/256 |
| 2011/0045287 A1 | 2/2011 | Kawashima et al. | |
| 2011/0303264 A1 | 12/2011 | Taniguchi et al. | |

FOREIGN PATENT DOCUMENTS

| | | | |
|---|---|---|---|
| CN | 101517750 A | | 8/2009 |
| EP | 1 958 997 A1 | | 8/2008 |
| EP | 2 048 194 A1 | | 4/2009 |
| EP | 2 455 980 A1 | | 5/2012 |
| JP | 58 60579 | | 4/1983 |
| JP | 2001 332750 | | 11/2001 |
| JP | 2010 504646 | | 2/2010 |
| JP | 2010 59277 | | 3/2010 |
| JP | WO 2010/042335 | * | 4/2010 |
| JP | 2011 40735 | | 2/2011 |
| JP | 2011 74263 | | 4/2011 |
| WO | 2007 061030 | | 5/2007 |
| WO | 2008 015984 | | 2/2008 |
| WO | WO 2008/036707 A2 | | 3/2008 |
| WO | 2010 042335 | | 4/2010 |

OTHER PUBLICATIONS

Combined Chinese Office Action and Search Report issued Jan. 4, 2015 in Patent Application No. 201180037009.4 (with English Translation of Category of Cited Documents).
International Search Report Issued Aug. 30, 2011 in PCT/JP11/67226 Filed Jul. 28, 2011.
U.S. Appl. No. 13/819,170, filed Feb. 26, 2013, Otsuka, et al.
U.S. Appl. No. 14/376,722, filed Aug. 5, 2014, Nishioka, et al.
Extended European Search Report issued Nov. 21, 2013 in Patent Application No. 11812554.1.

* cited by examiner

SOLAR CELL SEALING MATERIAL, AND SOLAR CELL MODULE PREPARED BY USING SAME

CROSS REFERENCE TO RELATED APPLICATION

This application is a 371 of PCT/JP2011/067226, filed on Jul. 28, 2011, and claims priority to Japanese Patent Application 2010-169831, filed on Jul. 28, 2010.

TECHNICAL FIELD

The present invention relates to an encapsulant material for solar cell elements in solar cell modules, and to a solar cell module produced by using the encapsulant material, and more precisely relates to a solar cell encapsulant material which facilitates production of solar cell modules, which does not require a crosslinking process and which is excellent in heat resistance and others, and to a solar cell module produced by using the encapsulant material.

BACKGROUND ART

Recently, with the increase in public awareness of environmental issues such as global warming and others, expectations for solar power generation have been much raised in view of the cleanness thereof and freeness from environmental pollution. A solar cell constitutes the main part of a solar power generation system which directly converts the energy of sunlight into electricity. Regarding the configuration of the solar cell, multiple solar cell elements (simply referred to as cells) are connected in series or in parallel and are packaged for protecting the cells to give individual units. The unit installed in the package is referred to as a solar cell module, and, in general, this is so designed that the face thereof to be exposed to sunlight is covered with a transparent substrate as a top protective material (glass/translucent solar cell sheet; front sheet) and sealed up with an encapsulant material (encapsulant resin layer) of a thermoplastic plastic (for example, ethylene-vinyl acetate copolymer), and the back thereof is protected with a back sealing sheet (back sheet) as a back protective material.

Those solar cell modules are mainly used outdoors, and are therefore required to satisfy various properties in point of the configuration, the material constitution and others thereof. Mainly the above-mentioned encapsulant material is required to have softness and impact resistance for protecting solar cell elements, heat resistance for protecting solar cell modules in heat generation, transparency (whole light transmittance, etc.) for efficient arrival of sunlight to solar cell elements, durability, dimensional stability, flame retardation, water vapor barrier performance, etc.

At present, as an encapsulant material for solar cell elements in solar cell modules, an ethylene-vinyl acetate copolymer (hereinafter this may be abbreviated as EVA) is widely used as the constituent material thereof, from the viewpoint of softness, transparency and the like (for example, see Patent Reference 1). Mainly for imparting heat resistance to EVA, crosslinking is attained with an organic peroxide serving as a crosslinking agent. For this, there is employed a method of previously preparing an EVA sheet mixed with a crosslinking agent (organic peroxide) and a crosslinking promoter and sealing up solar cell elements by the use of the resulting sheet. In the process of preparing the sheet, molding at a low temperature at which the organic peroxide used is not decomposed (in general, 80 to 100° C. or so) is needed, and therefore, it is difficult to elevate the speed of extrusion molding; and the sealing process for solar cell elements requires two steps of a step of degassing and temporarily bonding in a laminator taking from a few minutes to a dozen more minutes and another step of finally bonding (crosslinking) in an oven at a high temperature at which the organic peroxide is decomposed (in general, 130 to 150° C. or so) taking a few minutes to 60 minutes or so. Consequently, the production of solar cell modules requires a number of processes and much time, therefore providing a problem of increasing the production cost.

Another problem with the encapsulant material for solar cell elements using the EVA sheet is that the solar cell circuit may be corroded by acetic acid to be generated by EVA through hydrolysis in long-term use; and in addition, owing to the crosslinking agent, the crosslinking promoter and even the generated acetic acid, there may occur another problem of delamination at the interface to the solar cell element or at the interface to the front sheet, or even at the interface to the back sheet.

Against these problems, for example, Patent Reference 2 discloses a solar cell encapsulant material of a polymer blend or a polymer alloy that comprises at least one polyolefin-based copolymer and at least one crystalline polyolefin, as a solar cell encapsulant material not using an EVA sheet and not requiring a crosslinking step.

Patent Reference 3 discloses a solar cell encapsulant material that contains a propylen-based polymer having a melting point of 100° C. or higher and an ethylene-α-olefin copolymer, etc.

CITATION LIST

Patent References

Patent Reference 1: JP-A-58-60579
Patent Reference 2: JP-A-2001-332750
Patent Reference 3: WO2007/061030

SUMMARY OF THE INVENTION

Problems that the Invention is to Solve

Patent Reference 2 and Patent Reference 3 say that, for imparting heat resistance to the solar cell encapsulant material for which a crosslinking step may be omitted, it is important that the melting point (crystal melting peak temperature) in differential scanning calorimetry is from 100 to 110° C. or higher. However, even when a resin composition satisfying the requirement is used, the heat resistance is not as yet satisfactory.

An object of the present invention is to provide a solar cell encapsulant material which facilitates production of solar cell modules, which does not require a crosslinking step and which is excellent in heat resistance and others, and to provide a solar cell module produced by the use of the encapsulant material.

Means for Solving the Problems

As a result of assiduous studies, the present inventors have found that, when a resin composition containing a combination of olefin-based polymers having specific thermal properties is used, then a solar cell encapsulant material not requiring a crosslinking step and excellent in heat resistance and others can be obtained, and have completed the present invention.

Specifically, the present invention relates to a solar cell encapsulant material comprising a resin composition (C) that contains an olefin-based polymer (A) satisfying the following requirement (a) and an olefin-based polymer (B) satisfying the following requirement (b):

(a) The crystal melting peak temperature of the polymer, as measured at a heating rate of 10° C./min in differential scanning calorimetry, is lower than 100° C.;

(b) The extrapolated onset temperature of melting of the polymer, as measured at a heating rate of 10° C./min in differential scanning calorimetry, is 100° C. or higher.

The present invention also relates to a solar cell module produced by the use of the above-mentioned solar cell encapsulant material of the present invention.

Advantage of the Invention

According to the present invention, there are provided a solar cell encapsulant material which facilitates production of solar cell modules, which does not require a crosslinking step and which is excellent in heat resistance and others, and a solar cell module produced by the use of the encapsulant material.

Not requiring a crosslinking step, the solar cell encapsulant material can enhance the productivity in a process of producing solar cell modules. Further, regarding the production equipment, the present invention is applicable not only to a batch-type production line but also to a roll-to-roll production line, and as a result, the present invention is expected to be effective for greatly reducing the production cost for solar cell modules.

MODE FOR CARRYING OUT THE INVENTION

The present invention is described in detail hereinunder.
The solar cell encapsulant material of the present invention comprises a resin composition (C) that contains an olefin-based polymer (A) satisfying the following requirement (a) and an olefin-based polymer (B) satisfying the following requirement (b):

(a) The crystal melting peak temperature of the polymer, as measured at a heating rate of 10° C./min in differential scanning calorimetry, is lower than 100° C.;

(b) The extrapolated onset temperature of melting of the polymer, as measured at a heating rate of 10° C./min in differential scanning calorimetry, is 100° C. or higher.

[Olefin-Based Polymer (A)]

The olefin-based polymer (A) for use in the present invention is not specifically defined so far as it satisfies the above-mentioned requirement (a), and includes, for example, the following (A-1) to (A-4).

(A-1) A copolymer of ethylene and an α-olefin having from 3 to 20 carbon atoms.

(A-2) A copolymer of propylene and any other copolymerizable monomer, or a propylene homopolymer.

(A-3) A metal salt of a copolymer of an α-olefin such as ethylene, propylene or the like, and a monomer selected from aliphatic unsaturated carboxylic acids.

(A-4) An ethylenic copolymer comprising ethylene and at least one monomer selected from vinyl acetate, aliphatic unsaturated carboxylic acids and alkyl esters of aliphatic unsaturated monocarboxylic acids.

In the present invention, preferred are those of (A-1) and (A-2), from the viewpoint of the softness of the solar cell encapsulant material to be obtained, the presence of few fish eyes (gel spots), the presence of few circuit-corrosive substances (acetic acid, etc.), the economic potential, etc.; and more preferred are those of (A-1) from the viewpoint of the excellent low-temperature properties thereof.

(A-1) is a copolymer of ethylene and an α-olefin having from 3 to 20 carbon atoms. In this, the α-olefin to copolymerize with ethylene includes propylene, 1-butene, 1-pentene, 1-hexene, 1-heptene, 1-octene, 1-nonene, 1-decene, 3-methyl-butene-1,4-methyl-pentene-1, etc. In the present invention, propylene, 1-butene, 1-hexene and 1-octene are preferably used as the α-olefin to copolymerize with ethylene, from the viewpoint of the industrial availability, various special properties and the economic potential thereof. From the viewpoint of the transparency and the softness thereof, preferred is use of an ethylene-α-olefin random copolymer. One alone or two or more different types of α-olefins to copolymerize with ethylene may be used here either singly or as combined.

The content of the α-olefin to copolymerize with ethylene is not specifically defined so far as it satisfies the above-mentioned requirement (a). In general, the content is 2 mol % or more relative to the total monomer units in the copolymer (A-1) of ethylene and an α-olefin having from 3 to 20 carbon atoms, and preferably 40 mol % or less, more preferably from 3 to 30 mol %, even more preferably from 5 to 25 mol %. Falling within the range, the comonomer may reduce the crystallinity of the copolymer and may therefore enhance the transparency thereof; and another advantage thereof is that the raw material pellets are prevented from blocking together. The type and the content of the monomer to copolymerize with ethylene may be determined through qualitative and quantitative analysis according to a known method, for example, using a nuclear magnetic resonance (NMR) apparatus or any other analyzer.

The copolymer (A-1) of ethylene and an α-olefin having from 3 to 20 carbon atoms may contain any other monomer unit derived from other monomers than α-olefins, so far as it satisfies the above-mentioned requirement (a). The additional monomer includes, for example, cyclic olefins, vinyl-aromatic compounds (styrene, etc.), polyene compounds, etc. The content of the additional monomer units is preferably 20 mol % or less based on all the monomer units, 100 mol % in the copolymer (A-1) of ethylene and an α-olefin having from 3 to 20 carbon atoms, more preferably 15 mol % or less. The configuration, the branching, the branching degree distribution and the molecular weight distribution of the copolymer (A-1) of ethylene and an α-olefin having from 3 to 20 carbon atoms are not specifically defined, so far as the copolymer satisfies the above-mentioned requirement (a). For example, a copolymer having long-chain branches could generally have good mechanical properties and have advantages in that its melt tension in molding into sheets is high and the calendering moldability thereof is good. A copolymer having a narrow molecular weight distribution, as produced through polymerization with a single-site catalyst, contains few low-molecular-weight components, and another advantage thereof is that the raw material pellets hardly block together.

Not specifically defined, the melt flow rate (MFR) of the copolymer (A-1) of ethylene and an α-olefin having from 3 to 20 carbon atoms for use in the present invention is generally from 0.5 to 100 g/10 min or so as MFR thereof (JIS K7210, temperature: 190° C., load: 21.18 N), more preferably from 2 to 50 g/10 min, even more preferably from 3 to 30 g/10 min. In this, MFR may be selected in consideration of the moldability and the workability in molding into sheets, the adhesiveness and the spreadability in sealing solar cell elements (simply referred to as cells), etc. For example, when sheets are produced through calender-molding, MFR of the copolymer to be used is preferably a relatively low value, concretely from 0.5 to 5 g/10 min or so in view of the handleability in peeling the sheet from molding rolls; but when sheets are produced through extrusion using a T-die, MFR of the copolymer is preferably from 2 to 50 g/10 min, more preferably from 3 to 30 g/10 min from the viewpoint of reducing the extrusion load and increasing the extrusion output. Further, from the viewpoint of the adhesiveness and the spreadability in sealing solar cell elements (simply referred to as cells), MFR of the copolymer to be used is preferably from 2 to 50 g/10 min, more preferably from 3 to 30 g/10 min.

The production method for the copolymer (A-1) of ethylene and an α-olefin having from 3 to 20 carbon atoms for use in the present invention is not specifically defined, for which is employable any known polymerization method using a known olefin polymerization catalyst. For example, there are mentioned a slurry polymerization method, a solution polymerization method, a bulk polymerization method, a vapor-phase polymerization method or the like using a multi-site catalyst such as typically a Ziegler-Natta catalyst, or a single-site catalyst such as typically a metallocene catalyst or a post-metallocene catalyst, and a bulk polymerization method using a radical initiator, etc. In the present invention, from the viewpoint of attaining easy granulation (pelletization) after polymerization and from the viewpoint of preventing the raw material pellets from blocking together, preferred is a polymerization method using a single-site catalyst, in which a raw material can be polymerized to give a polymer having few low-molecular-weight components and having a narrow molecular weight distribution.

The heat of crystal fusion of the copolymer (A-1) of ethylene and an α-olefin having from 3 to 20 carbon atoms for use in the present invention, as measured at a heating rate of 10° C./min in differential scanning calorimetry, is preferably from 0 to 70 μg. Falling within the range, the copolymer is preferred as capable of securing the softness and the transparency (total light transmission) of the solar cell encapsulant material of the present invention. In view of the fact that raw material pellets may readily block together at high temperatures in summer, the heat of crystal fusion of the copolymer is preferably from 5 to 70 μg, more preferably from 10 to 65 μg. Some reference data of heat of crystal fusion are shown here. Ordinary high-density polyethylene (HDPE) has from 170 to 220 μg or so, and low-density polyethylene resin (LDPE) and linear low-density polyethylene (LLDPE) has from 100 to 160 μg or so.

The heat of crystal fusion may be measured at a heating rate of 10° C./min, using a differential scanning calorimeter and according to JIS K7122.

Specific examples of the copolymer (A-1) of ethylene and an α-olefin having from 3 to 20 carbon atoms for use in the present invention include Dow Chemical's trade names "Engage" and "Affinity", Mitsui Chemical's trade names "TAFMER A" and TAFMER P", Japan Polyethylene's trade name "Kernel" and others satisfying the above-mentioned requirement (a).

(A-2) is a copolymer of propylene and any other copolymerizable monomer, or a propylene homopolymer. These are not specifically defined in point of the copolymerization mode (random, block, etc.), the branching, the branching distribution and the configuration thereof. These may be any of an isotactic, atactic or syndiotactic structure polymer or a polymer with a mixed structure thereof. The other copolymerizable monomer includes ethylene, α-olefins having from 4 to 12 carbon atoms such as 1-butene, 1-hexene, 4-methyl-pentene-1,1-octene, etc.; dienes such as divinylbenzene, 1,4-cyclohexadiene, dicyclopentadiene, cyclo-octadiene, ethylidene-norbornene, etc. In the present invention, from the viewpoint of the industrial availability, various special properties and the economic potential thereof, ethylene and 1-butene are preferably used for the α-olefin to copolymerize with propylene. From the viewpoint of transparency and softness thereof, preferably used here is a propylene/α-olefin random copolymer. One alone or two or more different types of monomers to copolymerize with propylene may be used here either singly or as combined.

The content of the other monomer to copolymerize with propylene is not specifically defined so far as it satisfies the above-mentioned requirement (a). In general, the content is 2 mol % or more relative to the total monomer units in the copolymer (A-2) of propylene and any other copolymerizable monomer, and preferably 40 mol % or less, more preferably from 3 to 30 mol %, even more preferably from 5 to 25 mol %. Falling within the range, the comonomer may reduce the crystallinity of the copolymer and may therefore enhance the transparency thereof; and another advantage thereof is that the raw material pellets hardly block together. The type and the content of the monomer capable of copolymerizing with propylene may be determined through qualitative and quantitative analysis according to a known method, for example, using a nuclear magnetic resonance (NMR) apparatus or any other analyzer.

Not specifically defined, the melt flow rate (MFR) of the copolymer of propylene and any other copolymerizable monomer or the propylene homopolymer (A-2) for use in the present invention is generally from 0.5 to 100 g/10 min or so as MFR thereof (JIS K7210, temperature: 230° C., load: 21.18 N), more preferably from 2 to 50 g/10 min, even more preferably from 3 to 30 g/10 min. In this, MFR may be selected in consideration of the moldability and the workability in molding into sheets, the adhesiveness and the spreadability in sealing solar cell elements (simply referred to as cells), etc. For example, when sheets are produced through calender-molding, MFR of the polymer to be used is preferably a relatively low value, concretely from 0.5 to 5 g/10 min or so in view of the handleability in peeling the sheet from molding rolls; but when sheets are produced through extrusion using a T-die, MFR of the polymer is preferably from 2 to 50 g/10 min, more preferably from 3 to 30 g/10 min from the viewpoint of reducing the extrusion load and increasing the extrusion output. Further, from the viewpoint of the adhesiveness and the spreadability in sealing solar cell elements (simply referred to as cells), MFR of the polymer to be used is preferably from 2 to 50 g/10 min, more preferably from 3 to 30 g/10 min.

The production method for the copolymer of propylene and any other copolymerizable monomer or the propylene homopolymer (A-2) for use in the present invention is not specifically defined, for which is employable any known polymerization method using a known olefin polymerization catalyst. For example, there are mentioned a slurry polymerization method, a solution polymerization method, a bulk polymerization method, a vapor-phase polymerization method or the like using a multi-site catalyst such as typically a Ziegler-Natta catalyst, or a single-site catalyst such as typically a metallocene catalyst or a post-metallocene catalyst, and a bulk polymerization method using a radical initiator, etc. In the present invention, from the viewpoint of attaining easy granulation (pelletization) after polymerization and from the viewpoint of preventing the raw material pellets from blocking together, preferred is a polymerization method using a single-site catalyst, in which a raw material can be polymerized to give a polymer having few low-molecular-weight components and having a narrow molecular weight distribution.

Specific examples of the copolymer of propylene and any other copolymerizable monomer or the propylene homopolymer (A-2) for use in the present invention include propylene/butene random copolymers, propylene/ethylene random copolymers, propylene/ethylene/butene-1 copolymers, etc.; and as commercial products, there are mentioned Mitsui Chemical's trade name "TAFMER XM", Dow Chemical's trade name "VERSIFY" and others satisfying the above-mentioned requirement (a).

(A-3) is a metal salt of a copolymer of an α-olefin such as ethylene, propylene or the like, and a monomer selected from aliphatic unsaturated carboxylic acids (in which the metal is preferably Zn, Na, K, Li, Mg or the like). As commercial products, there are mentioned Mitsui Chemical's trade name "HIMILAN", Dow Chemical's trade name "AMPLIFY IO" and others satisfying the above-mentioned requirement (a).

(A-4) is an ethylenic copolymer comprising ethylene and at least one monomer selected from vinyl acetate, aliphatic unsaturated carboxylic acids and alkyl esters of aliphatic unsaturated monocarboxylic acids. Concretely, there are mentioned ethylene-acrylic acid copolymers, ethylene-methacrylic acid copolymers, ethylene-acrylate copolymers (in which the ester moiety is selected from an alcohol having from 1 to 8 carbon atoms, such as methyl, ethyl, propyl, butyl or the like), ethylene-methacrylate copolymers (in which the ester moiety is selected from an alcohol having from 1 to 8 carbon atoms, such as methyl, ethyl, propyl, butyl or the like), etc. However, the copolymer is not limited to these binary copolymers, but may be a ternary or more polynary copolymers with any third component added thereto (for example, ternary or more polynary copolymer suitably selected from ethylene, aliphatic unsaturated carboxylic acids and esters of aliphatic unsaturated carboxylic acids and the like). The content of the carboxylic acid group or a carboxylate ester group to copolymerize with ethylene may be generally from 5 to 35% by weight relative to all the monomer units in the copolymer.

The olefin-based polymer (A) for use in the present invention must satisfy the requirement (a) that the crystal melting peak temperature of the polymer, as measured at a heating rate of 10° C./min in differential scanning calorimetry, is lower than 100° C. In this, when the crystal melting peak temperature of the polymer is lower than 100° C., then the polymer is favorable as readily securing the softness of the solar cell encapsulant material of the present invention. In the present invention, a polymer not expressing a crystal melting peak temperature, or that is an amorphous polymer is also usable; however, in consideration of blocking of raw material pellets, the crystal melting peak temperature of the polymer is preferably from 30 to 95° C., more preferably from 45 to 80° C., even more preferably from 60 to 80° C.

Some reference data of the crystal melting peak temperature are shown here. Ordinary high-density polyethylene (HDPE) has from 130 to 145° C. or so, low-density polyethylene resin (LDPE) and linear low-density polyethylene (LLDPE) has from 100 to 125° C. or so, ordinary homopolypropylene resin has 165° C. or so, and ordinary propylene-ethylene random copolymer has from 130 to 150° C. or so. The crystal melting peak temperature may be measured at a heating rate of 10° C./min, using a differential scanning calorimeter and according to JIS K7121.

[Olefin-Based Polymer (B)]

The olefin-based polymer (B) for use in the present invention is not specifically defined, so far as it satisfies the above-mentioned requirement (b). For example, there are mentioned the following (B-1) and (B-2).

(B-1) A copolymer of ethylene and an α-olefin having from 3 to 20 carbon atoms, or an ethylene homopolymer.

(B-2) A copolymer of propylene and any other copolymerizable monomer, or a propylene homopolymer.

In the present invention, preferred are those of (B-1) from the viewpoint of the heat resistance, the softness and low-temperature properties of the solar cell encapsulant material to be obtained, the presence of few corrosive substances (acetic acid, etc.), the economic potential, etc.

(B-1) is a copolymer of ethylene and an α-olefin having from 3 to 20 carbon atoms, or an ethylene homopolymer. The α-olefin to copolymerize with ethylene includes propylene, 1-butene, 1-pentene, 1-hexene, 1-heptene, 1-octene, 1-nonene, 1-decene, 3-methyl-butene-1,4-methyl-pentene-1, etc. In the present invention, propylene, 1-butene, 1-hexene and 1-octene are preferably used as the α-olefin to copolymerize with ethylene, from the viewpoint of the industrial availability, various special properties and the economic potential thereof. From the viewpoint of the transparency and the softness thereof, preferred is use of an ethylene-α-olefin random copolymer. One alone or two or more different types of α-olefins to copolymerize with ethylene may be used here either singly or as combined.

The content of the α-olefin to copolymerize with ethylene is not specifically defined so far as it satisfies the above-mentioned requirement (b). In general, the content is 2 mol % or more relative to the total monomer units in the copolymer (B-1) of ethylene and an α-olefin having from 3 to 20 carbon atoms, and preferably 20 mol % or less, more preferably from 3 to 20 mol %, even more preferably from 5 to 18 mol %. Falling within the range, the comonomer may reduce the crystallinity of the copolymer and may therefore enhance the transparency thereof. The type and the content of the monomer to copolymerize with ethylene may be determined through qualitative and quantitative analysis according to a known method, for example, using a nuclear magnetic resonance (NMR) apparatus or any other analyzer.

The copolymer (B-1) of ethylene and an α-olefin having from 3 to 20 carbon atoms may contain any other monomer unit derived from other monomers than α-olefins, so far as it satisfies the above-mentioned requirement (b). The additional monomer includes, for example, cyclic olefins, vinyl-aromatic compounds (styrene, etc.), polyene compounds, etc. The configuration, the branching, the branching degree distribution and the molecular weight distribution of the copolymer of ethylene and an α-olefin having from 3 to 20 carbon atoms or the ethylene homopolymer (B-1) are not specifically defined, so far as the polymer satisfies the above-mentioned requirement (b). For example, a copolymer having long-chain branches could generally have good mechanical properties and have advantages in that its melt tension in molding into sheets is high and the calendering moldability thereof is good. A copolymer having a narrow molecular weight distribution, as produced through polymerization with a single-site catalyst, contains few low-molecular-weight components, and another advantage thereof is that the raw material pellets hardly block together.

Not specifically defined, the melt flow rate (MFR) of the copolymer of ethylene and an α-olefin having from 3 to 20 carbon atoms or the ethylene homopolymer (B-1) for use in the present invention is generally from 0.5 to 100 g/10 min or so as MFR thereof (JIS K7210, temperature: 190° C., load: 21.18 N), more preferably from 2 to 50 g/10 min, even more preferably from 3 to 30 g/10 min. In this, MFR may be selected in consideration of the moldability and the workability in molding into sheets, the adhesiveness and the spreadability in sealing solar cell elements (simply referred to as cells), etc. For example, when sheets are produced through calender-molding, MFR of the polymer to be used is preferably a relatively low value, concretely from 0.5 to 5 g/10 min or so in view of the handleability in peeling the sheet from molding rolls; but when sheets are produced through extrusion using a T-die, MFR of the polymer is preferably from 2 to 50 g/10 min, more preferably from 3 to 30 g/10 min from the viewpoint of reducing the extrusion load and increasing the extrusion output. Further, from the viewpoint of the adhesiveness and the spreadability in sealing solar cell elements (simply referred to as cells), MFR of the polymer to be used is preferably from 2 to 50 g/10 min, more preferably from 3 to 30 g/10 min.

The production method for the copolymer of ethylene and an α-olefin having from 3 to 20 carbon atoms or the ethylene homopolymer (B-1) for use in the present invention is not specifically defined, for which is employable any known polymerization method using a known olefin polymerization catalyst. For example, there are mentioned a slurry polymerization method, a solution polymerization method, a bulk polymerization method, a vapor-phase polymerization method or the like using a multi-site catalyst such as typically a Ziegler-Natta catalyst, or a single-site catalyst such as typically a metallocene catalyst or a post-metallocene catalyst, and a bulk polymerization method using a radical initiator, etc. In the present invention, from the viewpoint of attaining easy granulation (pelletization) after polymerization and from the viewpoint of preventing the raw material pellets from blocking together, preferred is a polymerization method using a single-site catalyst, in which a raw material can be polymerized to give a polymer having few low-molecular-weight components and having a narrow molecular weight distribution.

The heat of crystal fusion of the copolymer (B-1) of ethylene and an α-olefin having from 3 to 20 carbon atoms for use in the present invention, as measured at a heating rate of 10° C./min in differential scanning calorimetry, is preferably from 5 to 70 J/g. Falling within the range, the copolymer is preferred as capable of securing the softness and the transparency (whole light transmittance) of the solar cell encapsulant material of the present invention, and in addition, the raw material pellets hardly block together in the preferred embodiment. From these, the heat of crystal fusion of the copolymer is preferably from 10 to 60 J/g, more preferably from 15 to 55 J/g. The method for measuring the heat of crystal fusion is as mentioned above.

Specific examples of the copolymer of ethylene and an α-olefin having from 3 to 20 carbon atoms or the ethylene propylene homopolymer (B-1) for use in the present invention include Dow Chemical's trade names "Affinity" and "Infuse", Japan Polyethylene's trade name "Karnel" and others satisfying the above-mentioned requirement (b).

(B-2) is a copolymer of propylene and any other copolymerizable monomer, or a propylene homopolymer. These are not specifically defined in point of the copolymerization mode (random, block, etc.), the branched structure, the branching degree distribution and the configuration thereof. These may be any of an isotactic, atactic or syndiotactic structure polymer or a polymer with a mixed structure thereof. The other copolymerizable monomer includes ethylene, α-olefins having from 4 to 12 carbon atoms such as 1-butene, 1-hexene, 4-methyl-pentene-1,1-octene, etc.; dienes such as divinylbenzene, 1,4-cyclohexadiene, dicyclopentadiene, cyclo-octadiene, ethylidene-norbornene, etc. In the present invention, from the viewpoint of the industrial availability, various special properties and the economic potential thereof, ethylene and 1-butene are preferably used for the α-olefin to copolymerize with propylene. From the viewpoint of transparency and softness thereof, preferably used here is a propylene-α-olefin random copolymer. One alone or two or more different types of monomers to copolymerize with propylene may be used here either singly or as combined.

The content of the other monomer to copolymerize with propylene is not specifically defined so far as it satisfies the above-mentioned requirement (b). In general, the content is 2 mol % or more relative to the total monomer units in the copolymer (B-2) of propylene and any other copolymerizable monomer, and preferably 40 mol % or less, more preferably from 3 to 30 mol %, even more preferably from 5 to 25 mol %. Falling within the range, the comonomer may reduce the crystallinity of the copolymer and may therefore enhance the transparency thereof; and another advantage thereof is that the raw material pellets hardly block together. The type and the content of the monomer capable of copolymerizing with propylene may be determined through qualitative and quantitative analysis according to a known method, for example, using a nuclear magnetic resonance (NMR) apparatus or any other analyzer.

Not specifically defined, the melt flow rate (MFR) of the copolymer of propylene and any other copolymerizable monomer or the propylene homopolymer (B-2) for use in the present invention is generally from 0.5 to 100 g/10 min or so as MFR thereof (JIS K7210, temperature: 230° C., load: 21.18 N), more preferably from 2 to 50 g/10 min, even more preferably from 3 to 30 g/10 min. In this, MFR may be selected in consideration of the moldability and the workability in molding into sheets, the adhesiveness and the spreadability in sealing solar cell elements (simply referred to as cells), etc. For example, when sheets are produced through calender-molding, MFR of the polymer to be used is preferably a relatively low value, concretely from 0.5 to 5 g/10 min or so in view of the handleability in peeling the sheet from molding rolls; but when sheets are produced through extrusion using a T-die, MFR of the polymer is preferably from 2 to 50 g/10 min, more preferably from 3 to 30 g/10 min from the viewpoint of reducing the extrusion load and increasing the extrusion output. Further, from the viewpoint of the adhesiveness and the spreadability in sealing solar cell elements (simply referred to as cells), MFR of the polymer to be used is preferably from 2 to 50 g/10 min, more preferably from 3 to 30 g/10 min.

The production method for the copolymer of propylene and any other copolymerizable monomer or the propylene homopolymer (B-2) for use in the present invention is not specifically defined, for which is employable any known polymerization method using a known olefin polymerization catalyst. For example, there are mentioned a slurry polymerization method, a solution polymerization method, a bulk polymerization method, a vapor-phase polymerization method or the like using a multi-site catalyst such as typically a Ziegler-Natta catalyst, or a single-site catalyst such as typically a metallocene catalyst or a post-metallocene catalyst, and a bulk polymerization method using a radical initiator, etc. In the present invention, from the viewpoint of attaining easy granulation (pelletization) after polymerization and from the viewpoint of preventing the raw material pellets from blocking together, preferred is a polymerization method using a single-site catalyst, in which a raw material can be polymerized to give a polymer having few low-molecular-weight components and having a narrow molecular weight distribution.

Specific examples of the copolymer of propylene and any other copolymerizable monomer or the propylene homopolymer (B-2) for use in the present invention include propylene-butene random copolymers, propylene-ethylene random copolymers, propylene-ethylene-butene-1 copolymers, etc.; and as commercial products, there are mentioned Mitsui Chemical's trade name "NOTIO", Sumitomo Chemical's trade name "TAFFCELLEN", Prime Polymer's trade name "PRIME TPO" and others satisfying the above-mentioned requirement (b).

Not specifically defined, the olefin-based polymer (B) for use in the present invention may be any one satisfying the above-mentioned requirement (b), but in the present invention, ethylene-α-olefin block copolymers of the above (B-1) are most preferably used as well balanced in heat resistance, softness and low-temperature properties thereof.

Not specifically defined, the block structure of the ethylene-α-olefin block copolymer may be any one satisfying the above-mentioned condition (b), but preferred is a multi-block structure comprising two or more segments or blocks differing from each other in point of the comonomer content, the crystallinity, the density, the crystal melting peak temperature (melting point Tm) or the glass transition temperature (Tg) thereof, from the viewpoint of attaining well-balanced softness, heat resistance, transparency and others. Concretely, there are mentioned a completely symmetric block structure, an asymmetric block structure, a tapered block structure (in which the proportion of the block structures gradually increase in the main chain), etc. Regarding the configuration of the copolymer having the multi-block structure and the production method for the copolymer, those described in detail in WO2005/090425, WO2005/090426, WO2005/090427 and others may be hereby incorporated by reference.

Next described in detail is the above-mentioned ethylene-α-olefin block copolymer having a multi-block structure.

The ethylene-α-olefin block copolymer having a multi-block structure is favorably used in the present invention, and preferred is an ethylene-octene multi-block copolymer in which 1-octene is the comonomer, α-olefin. The block copolymer is preferably a multi-block copolymer that comprises two or more, nearly amorphous soft segments in which the proportion of the copolymerized octene component copolymerized is large (about 15 to 20 mol %) relative to ethylene, and two or more, high-crystalline hard segments in which the proportion of the copolymerized octene component copolymerized is small (less than about 2 mol %) relative to ethylene and which have a crystal melting peak temperature of from 110 to 145° C. By suitably controlling the chain length and the proportion of these soft segments and hard segments therein, the block copolymer can be made to satisfy both softness and heat resistance.

Specific examples of the multi-block structure-having copolymer include Dow Chemical's trade name "Infuse".

The olefin-based polymer (B) for use in the present invention must satisfy the requirement (b) that the extrapolated onset temperature of melting of the polymer, as measured at a heating rate of 10° C./min in differential scanning calorimetry (JIS K7121), is 100° C. or higher. Preferably, the extrapolated onset temperature of melting is 102° C. or higher, more preferably 105° C. or higher. The polymer of which the extrapolated onset temperature of melting is 100° C. or higher is preferred as fully securing the heat resistance of the solar cell encapsulant material to be obtained. On the other hand, the uppermost limit of the extrapolated onset temperature of melting may be 150° C. or so in consideration of thermal degradation of the solar cell elements (simply referred to as cells) and the lamination temperature in producing solar cell modules. In the present invention, the extrapolated onset temperature of melting is preferably 130° C. or lower, more preferably 125° C. or lower since the temperature in producing solar cell modules can be lowered and since the solar cell elements (simply referred to as cells) hardly undergo thermal degradation. Specifically, the extrapolated onset temperature of melting is preferably from 100 to 150° C., more preferably from 100 to 130° C., even more preferably from 102 to 125° C.

In the present invention, preferably, the difference between the crystal melting peak temperature of the olefin-based polymer (A) (Tm(A)) and the extrapolated onset temperature of melting of the olefin-based polymer (B) (Tim(B)), (Tim(B)−Tm(A)) is 35° C. or higher, more preferably 40° C. or higher, in view of the balance among the softness, the transparency and the heat resistance of the solar cell encapsulant material to be obtained. The uppermost limit may be derived from the range of the crystal melting peak temperature of the olefin-based polymer (A) (Tm(A)) and the range of the extrapolated onset temperature of melting of the olefin-based polymer (B) (Tim(B)), as mentioned above, and is preferably approximately from 80 to 100° C. or so.

In this, the extrapolated onset temperature of melting is a value as defined as Tim in JIS K7121. Concretely, this is a temperature at the intersection between the straight line drawn by extending the base line on the low temperature side toward the high temperature side, and the tangent line drawn at the point at which the inclination to the curve of the crystal melting peak on the low temperature side is the maximum. The relationship between the extrapolated onset temperature of melting (Tim) and the crystal melting peak temperature (Tm) is Tim<Tm. The extrapolated onset temperature of melting (Tim) is expressed as "extrapolated onset point" in Perkin Elmer's "Pyris1 DSC".

[Resin Composition (C)]

The solar cell encapsulant material of the present invention comprises a resin composition (C) that contains the above-mentioned olefin-based polymer (A) and the above-mentioned olefin-based polymer (B). In this, the content of the olefin-based polymer (A) and the content of the olefin-based polymer (B) in the resin composition (C) are not specifically defined. In consideration of the softness, the heat resistance and the transparency of the solar cell encapsulant material to be obtained, they are preferably from 50 to 99% by mass and from 1 to 50% by mass, respectively, more preferably from 60 to 98% by mass and from 2 to 40% by mass, respectively, even more preferably from 70 to 97% by mass and from 3 to 30% by mass, respectively. The blend (content) ratio by mass of the olefin-based polymer (A) and the olefin-based polymer (B) is not also specifically defined, but is preferably olefin-based polymer (A)/olefin-based polymer (B)=(99 to 50)/(1 to 50), more preferably (98 to 60)/(2 to 40), even more preferably (97 to 70)/(3 to 30), still more preferably (97 to 80)/(3 to 20), further more preferably (97 to 90)/(3 to 10). The total of (A) and (B) is 100 parts by mass. The blend (content) ratio by mass falling within the range is preferably as readily providing the solar cell encapsulant material well-balanced in softness, heat resistance and transparency.

Any other resin may be mixed in the resin composition (C) constituting the solar cell encapsulant material of the present invention, not overstepping the spirit and the scope of the present invention and for the purpose enhancing various physical properties (softness, heat resistance, transparency, adhesiveness, etc.) and also the moldability, the workability and the economic potential of the encapsulant material. The additional resin includes, for example, other polyolefin-based resins and various elastomers (olefinic, styrenic and others), resins modified with a polar group such as a carboxyl group, an amino group, an imide group, a hydroxyl group, an epoxy group, an oxazoline group, a thiol group, a silanol group or the like, wastes in trimming such as trimming loss and the like (regenerated and added), tackiness-imparting resins, etc.

The tackiness-imparting resin includes petroleum resins, terpene reins, coumarone-indene resins, rosin-based resins, and their hydrogenated derivatives, etc. Concretely, as petroleum resins, there are mentioned alicyclic petroleum resins from cyclopentadiene or its dimer, and aromatic petroleum resins from a C9 component; as terpene resins, there are mentioned terpene resins and terpene-phenol resins from β-pinene; and as rosin-based resins, there are mentioned rosin resins such as gum rosin, wood rosin, etc., and esterified rosin resins modified with glycerin, pentaerythritol or the like. Mainly depending on the molecular weight thereof, the tackiness-imparting resin may have a different softening temperature. From the viewpoint of the miscibility thereof with the above-mentioned olefin-based polymer (A) and the above-mentioned olefin-based polymer (B), and the time-dependent bleeding behavior thereof in the encapsulant material, and also the color and the thermal stability thereof, preferred are hydrogenated derivatives of alicyclic petroleum resins having a softening temperature of from 100 to 150° C., preferably from 120 to 140° C. In case where any other resin than the above-mentioned olefin-based polymer (A) and olefin-based polymer (B) is mixed in the resin composition, in general, its content is preferably 20% by mass or less relative to 100% by mass of the resin composition (C), more preferably 10% by mass or less.

If desired, various types of additives may be added to the resin composition (C) constituting the solar cell encapsulant material of the present invention. The additives include, for example, a silane coupling agent, an antioxidant, a UV absorbent, a weather-resistant stabilizer, a light diffusing agent, a nucleating agent, a pigment (e.g., white pigment), a flame retardant, a discoloration inhibitor, etc. In the present invention, preferred is adding at least one additive selected from a silane coupling agent, an antioxidant, a UV absorbent and a weather-resistant stabilizer for the reasons mentioned below. In the present invention, it is unnecessary to add a crosslinking agent and a crosslinking promoter to the resin composition (C); however, the invention does not exclude the addition, and, for example, in case where high-level heat resistance is desired for the encapsulant material, a crosslinking agent and/or a crosslinking promoter may be added to the composition.

The silane coupling agent is effective for enhancing the adhesiveness of the encapsulant material to a protective material (front sheet, back sheet and others made of glass or resin) and to solar cell elements and others; and as its examples, there are mentioned compounds having an unsaturated group such as a vinyl group, an acryloxy group or a methacryloxy group, as well as an amino group, an epoxy group or the like, and additionally having a hydrolysable group such as an alkoxy group. Specific examples of the silane coupling agent include N-(β-aminoethyl)-γ-aminopropyltrimethoxysilane, N-(β-aminoethyl)-γ-aminopropylmethyldimethoxysilane, γ-aminopropyltriethoxysilane, γ-glycidoxypropyltrimethoxysilane, γ-methacryloxypropyltrimethoxysilane, etc. In the present invention, preferred is use of γ-glycidoxypropyltrimethoxysilane or γ-methacryloxypropyltrimethoxysilane as securing good adhesiveness and causing little discoloration such as yellowing. The amount of the silane coupling agent to be added is generally from 0.1 to 5 parts by mass or so relative to 100 parts by mass of the resin composition (C), preferably from 0.2 to 3 parts by mass. Like the silane coupling agent, any other coupling agent of an organic titanate compound or the like may also be used effectively here.

Various commercial products are usable here as the antioxidant. There are mentioned various types antioxidants such as monophenol-type, bisphenol-type, polymeric phenol-type, sulfur-containing and phosphite-type antioxidants, etc. The monophenol-based antioxidants include, for example, 2,6-di-tert-butyl-p-cresol, butylated hydroxyanisole, 2,6-di-tert-butyl-4-ethylphenol, etc. The bisphenol-type antioxidants include 2,2'-methylenebis(4-methyl-6-tert-butylphenol), 2,2'-methylenebis(4-ethyl-6-tert-butylphenol), 4,4'-thiobis(3-methyl-6-tert-butylphenol), 4,4'-butylidenebis(3-methyl-6-tert-butylphenol), 3,9-bis[{1,1-dimethyl-2-{R-(3-tert-butyl-4-hydroxy-5-methylphenyl)propionyloxy}ethyl}2,4,9,10-tetroxaspiro]-5,5-undecane, etc.

The polymeric phenol-type antioxidants include 1,1,3-tris(2-methyl-4-hydroxy-5-tert-butylphenyl)butane, 1,3,5-trimethyl-2,4,6-tris(3,5-di-tert-butyl-4-hydroxybenzyl)benzene, tetrakis-{methylene-3-(3',5'-di-tert-butyl-4'-hydroxyphenyl)propionate}methane, bis{(3,3'-bis-4'-hydroxy-3'-tert-butylphenyl)butyric acid}glucose ester, 1,3,5-tris(3',5'-di-tert-butyl-4'-hydroxybenzyl)-s-triazine-2,4,6-(1H,3H,5H)trione, triphenol (vitamin E), etc.

The sulfur-containing antioxidants include dilauroyl thiodipropionate, dimyristyl thiodipropionate, distearyl thiopropionate, etc.

The phosphite-type antioxidants include triphenyl phosphite, diphenylisodecyl phosphite, phenyldiisodecyl phosphite, 4,4'-butylidene-bis(3-methyl-6-tert-butylphenyl-di-tridecyl)phosphite, cyclic neopentane-tetrayl bis(octadecyl)phosphite, tris(mono and/or di)phenyl phosphite, diisodecyl pentaerythritol diphosphite, 9,10-dihydro-9-oxa-10-phosphaphenanthrene-10-oxide, 10-(3,5-di-tert-butyl-4-hydroxybenzyl)-9,10-dihydro-9-oxa-10-phosphaphenanthrene-10-oxide, 10-decyloxy-9,10-dihydro-9-oxa-10-phosphaphenanthrene, cyclic neopentane-tetrayl bis(2,4-di-tert-butylphenyl)phosphite, cyclic neopentane-tetrayl bis(2,6-di-tert-methylphenyl)phosphite, 2,2-methylenebis(4,6-tert-butylphenyl)octyl phosphite, etc.

In the present invention, preferably used are phenol-type and phosphite-type antioxidants from the viewpoint of the effect, the thermal stability and the economic potential thereof, and more preferably the two different types of antioxidants are combined for use herein. The amount of the antioxidant to be added is generally from 0.1 to 1 part by mass or so relative to 100 parts by mass of the resin composition (C), but preferably from 0.2 to 0.5 parts by mass.

Various commercial products are usable here as the UV absorbent, including various types of benzophenone-type, benzotriazole-type, triazine-type or salicylate-type UV absorbents and others. The benzophenone-type UV absorbents include, for example, 2-hydroxy-4-methoxybenzophenone, 2-hydroxy-4-methoxy-2'-carboxybenzophenone, 2-hydroxy-4-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenone, 2-hydroxy-5-chlorobenzophenone, 2,4-dihydroxybenzophenone, 2,2'-dihydroxy-4-methoxybenzophenone, 2,2'-dihydroxy-4,4'-dimethoxybenzophenone, 2,2',4,4'-tetrahydroxybenzophenone, etc.

The benzotriazole-type UV absorbents include hydroxyphenyl-substituted benzotriazole compounds, for example, 2-(2-hydroxy-5-methylphenyl)benzotriazole, 2-(2-hydroxy-5-t-butylphenyl)benzotriazole, 2-(2-hydroxy-3,5-dimethylphenyl)benzotriazole, 2-(2-methyl-4-hydroxyphenyl)benzotriazole, 2-(2-hydroxy-3-methyl-5-t-butylphenyl)benzotriazole, 2-(2-hydroxy-3,5-di-t-amylphenyl)benzotriazole, 2-(2-hydroxy-3,5-di-t-butylphenyl)benzotriazole, etc. The triazine-type UV absorbents include 2-[4,6-bis(2,4-dimethylphenyl)-1,3,5-triazin-2-yl]-5-(octyloxy)phenol, 2-(4,6-diphenyl-1,3,5-triazin-2-yl)-5-(hexyloxy)phenol, etc. The salicylate-type UV absorbents include phenyl salicylate, p-octylphenyl salicylate, etc.

The amount of the UV absorbent to be added is generally from 0.01 to 2.0 parts by mass or so relative to 100 parts by mass of the resin composition (C), but preferably from 0.05 to 0.5 parts by mass.

As the weather-resistant stabilizer for imparting weather resistance apart from the above-mentioned UV absorbent, preferred is use of hindered amine-type light stabilizers. The hindered amine-type light stabilizer does not absorb UV rays, different from UV absorbents, but when combined with a UV-absorbent, it exhibits a noticeable synergistic effect. Some others than hindered amine-type compounds may function as a light stabilizer, but many of such compounds are colored and are therefore unfavorable for use in the solar cell encapsulant material of the present invention.

The hindered amine-type light stabilizer includes dimethyl succinate-1-(2-hydroxyethyl)-4-hydroxy-2,2,6,6-tetramethyl piperidine polycondensate, poly[{6-(1,1,3,3-tetramethylbutyl)amino-1,3,5-triazine-2,4-diyl}{(2,2,6,6-tetramethyl-4-piperidyl)imino}hexamethylene{{2,2,6,6-tetramethyl-4-piperidyl}imino}], N,N'-bis(3-aminopropyl)ethylenediamine-2,4-bis[N-butyl-N-(1,2,2,6,6-pentamethyl-4-piperidyl)amino]-6-chloro-1,3,5-triazine condensate, bis(2,2,6,6-tetramethyl-4-piperidyl)sebacate, bis(1,2,2,6,6-pentamethyl-4-piperidyl)2-(3,5-di-tert-4-hydroxybenzyl)-2-n-butylmalonate, etc. The amount of the hindered amine-type light stabilizer to be added is generally from 0.01 to 0.5 parts by mass or so relative to 100 parts by mass of the resin composition (C), but is preferably from 0.05 to 0.3 parts by mass.

[Solar Cell Encapsulant Material and its Production Method]

The solar cell encapsulant material of the present invention comprises the above-mentioned resin composition (C).

The solar cell encapsulant material of the present invention may be suitably controlled in point of the softness thereof, in consideration of the shape and the thickness of the solar cell to which it is applied and of the site where the solar cell is installed. For example, the storage elastic modulus (E') of the encapsulant material is preferably from 1 to 2000 MPa, as measured through dynamic viscoelasticity measurement at a oscillation frequency of 10 Hz and at a temperature of 20° C. In consideration of the ability thereof to protect solar cell elements and of the softness thereof, the storage elastic modulus of the encapsulant material is preferably from 1 to 100 MPa, more preferably from 5 to 50 MPa. In consideration of the handleability of the solar cell encapsulant material of the present invention that is prepared in the form of a sheet or the like, or in consideration of other matters of the sheet-like encapsulant material that the sheets are prevented from blocking together at their surfaces and that as to whether or not the sheet-like encapsulant material could reduce the weight of solar cell modules (in general, as to whether or not thin glass films (having a thickness of 1.1 mm or so) are applicable to the sheet-like encapsulant material having a thickness of 3 mm or so, or as to whether or not the sheet-like encapsulant material is applicable to glass-less configurations), the storage elastic modulus of the encapsulant material is preferably from 100 to 800 MPa, more preferably from 200 to 600 MPa. The storage elastic modulus (E') may be determined by the use of a viscoelasticity-measuring apparatus, with which the encapsulant material is analyzed at a oscillation frequency of 10 Hz within a predetermined temperature range and the value of the storage elastic modulus of the analyzed encapsulant material at a temperature of 20° C. is obtained.

The heat resistance of the solar cell encapsulant material of the present invention is influenced by various properties of the olefin-based polymer (A) (crystal melting peak temperature, heat of crystal fusion, MFR, molecular weight, etc.), and various properties of olefin-based polymer (B) (extrapolated onset temperature of melting, crystal melting peak temperature, heat of crystal fusion, MFR, molecular weight, etc.), and can be controlled by suitably selecting these parameters of the polymers, and in particular, the extrapolated onset temperature of melting of the olefin-based polymer (B) has a significant influence thereon. In general, solar cell modules are heated up to 85° C. or so by the heat generated during power generation or by the radiation heat of sunlight; however, so far as the extrapolated onset temperature of melting is 100° C. or higher, the solar cell encapsulant material of the present invention can secure the necessary heat resistance and therefore the temperature range is favorable here. In the present invention, a sheet-like sample having a thickness of 0.5 mm of the encapsulant material was sandwiched between a white glass board having a thickness of 3 mm (size: 75 mm in length, 25 mm in width) and an aluminium plate having a thickness of 5 mm (size: 120 mm in length, 60 mm in width), and laminated under pressure using a vacuum pressing machine at 150° C. for 15 minutes to produce a laminate sample; the sample is installed in a constant-temperature constant-humidity tank at 85° C. and 85% RH, as inclined by 60 degrees therein; and after 2000 hours, the condition of the laminate sample was checked. Those in which the glass did not shift from the initial standard position are considered good (○), while whole in which the glass shifted from the initial standard position or in which the sheet melted are considered not good (x); and in that manner, the heat resistance of the encapsulant material was evaluated.

The whole light transmittance (JIS K7105) of the solar cell encapsulant material of the present invention may not be that important depending on the type of the solar cells to which the encapsulant material is applied, or for example, in case where the encapsulant material is applied to amorphous thin-film silicon parts or the like at which the sunlight to reach the solar cell element is not so much blocked; however, in consideration of the photoelectric conversion efficiency of solar cells to which the encapsulant material is applied or of the handleability of the encapsulant material in laminating various parts therewith, the whole light transmittance of the encapsulant material is preferably 85% or higher, more preferably 88% or higher, even more preferably 90% or higher.

The softness, the heat resistance and the transparency of the solar cell encapsulant material of the present invention may be often paradoxical properties. Concretely, when the crystallinity of the resin composition (C) to be used is too much lowered for enhancing the softness thereof, then the heat resistance thereof may lower and may be therefore insufficient. On the other hand, when the crystallinity of the resin composition (C) to be used is too much increased, then the transparency may lower and may be therefore insufficient. In consideration of the balance among these, when the storage elastic modulus (E') in dynamic viscoelasticity measurement at a oscillation frequency of 10 Hz and at a temperature of 20° C. is referred to as the index of softness, when the extrapolated onset temperature of melting of the olefin-based polymer (B), as measured at a heating rate of 10° C./min in differential scanning calorimetry, is referred to as the index of heat resistance, and when the whole light transmittance is referred to as the index of transparency, it is desirable that these three indices are that the storage elastic modulus (E') is from 1 to 2000 MPa, the extrapolated onset temperature of melting is 100° C. or higher and the whole light transmittance is 85% or higher, for the purpose of satisfying all those softness, heat resistance and transparency; and more preferably, the storage elastic modulus (E') is from 5 to 800 MPa, the extrapolated onset temperature of melting is from 102 to 150° C. and the whole light transmittance is 85% or higher, even more preferably, the storage elastic modulus (E') is from 10 to 600 MPa, the extrapolated onset temperature of melting is from 105 to 130° C. and the whole light transmittance is 88% or higher.

The thickness of the solar cell encapsulant material of the present invention is not specifically defined. In general, the encapsulant material is used in the form of a sheet having a thickness of from 0.03 to 1 mm or so, preferably from 0.1 to 0.7 mm.

Next described is a production method for the solar cell encapsulant material of the present invention. As the production method for a sheet-like solar cell encapsulant material, herein employable is a known method, for example, an extrusion casting method, a calendering method, an inflation method or the like equipped with a melt mixing apparatus such as using a single-screw extruder, a multi-screw extruder, a Banbury mixer, a kneader or the like and using a T-die. Though not specifically defined, in the present invention, preferred is an extrusion casting method using a T-die, from the viewpoint of the handleability and the productivity. The molding temperature in the extrusion casting method using a T-die may be suitably controlled depending on the flow properties and the film formability of the resin composition (C) to be used, but may be generally from 130 to 300° C., preferably from 150 to 250° C.

Various additives such as a silane coupling agent, an antioxidant, a UV absorbent, a weather-resistant stabilizer and the like may be dry-blended with resin and then fed into a hopper; or all the materials may be previously melt-mixed and pelletized, and then the pellets may be fed thereinto; or a master batch in which the additives alone are previously concentrated in resin may be prepared and fed into the production line. If desired, the surface and/or the back of the solar cell encapsulant material of the present invention, which has been produced in the form of a sheet, may be embossed or may be processed in any other mode to form projections thereon (in conical, pyramid-like, semi-like or any other form), for the purpose of preventing the surfaces of the sheet from blocking together in rolling up the sheet or for the purpose of enhancing the handleability and the degassing operation in a sealing process for solar cell elements.

The solar cell encapsulant material of the invention is often used in the form of a single-layer configuration as mentioned above; however, a plurality of the resin compositions (C) that differ from each other in the constitutive ingredients or in the compositional ratio of the ingredients may be co-extruded through a multilayer die to produce a laminate configuration of two or more layers, and the embodiment of the type is also preferred here. Specifically, it is desirable that the laminate configuration of two or more layers contains multiple layers of resin compositions (C) that differ in point of the storage elastic modulus (E') in dynamic viscoelasticity measurement; and for example, there is mentioned a two-type three-layer configuration of soft layer (D-1)/hard layer (D-2)/soft layer (D-1) in which the soft layer (D-1) is on the side on which the encapsulant material is adhered to a solar cell element and the hard layer (D-2) is an interlayer. In the present invention, the soft layer (D-1) is a layer of which the storage elastic modulus (E') in dynamic viscoelasticity measurement at a oscillation frequency of 10 Hz and at a temperature of 20° C. is less than 100 MPa, preferably from 5 to 50 MPa, and the hard layer (D-2) is a layer of which the storage elastic modulus (E') is at least 100 MPa, preferably from 200 to 800 MPa. Preferably, both the soft layer and the hard layer are formed of the resin composition (C) in the present invention. Employing the laminate configuration of the type is preferred as relatively easily realizing both the performance of protecting solar cell elements and the handleability of the entire encapsulant material (in point of the elastic modulus at room temperature thereof). Thus realizing both the rigidity and the softness at room temperature of the encapsulant material makes it possible to apply the encapsulant material to thin glass plates (for example, having a thickness of 1.1 mm or the like) or to glassless configurations, thereby contributing toward weight reduction of solar cells (see Example 4). In this, the thickness of the soft layer that is adhered to a solar cell element is not specifically defined, but in consideration of the performance of protecting solar cell elements and of the spreadability of resin, the thickness is preferably 0.005 mm or more, more preferably from 0.02 to 0.2 mm. The thickness of the soft layers may be the same or different.

In case where the solar cell encapsulant material of the present invention is used in the form of a laminate configuration, the above-mentioned, two-type three-layer configuration of soft layer/hard layer/soft layer is preferred. However, for the purpose of enhancing the properties of solar cell modules or for controlling the outward appearance thereof (for preventing warping, etc.), any other laminate configuration is also employable here. For example, there are mentioned a two-type two-layer configuration of soft layer/hard layer, soft layer (containing additive)/soft layer (not containing additive), soft layer (containing additive A)/soft layer (containing additive B) in which the additive formulation differs, or soft layer (A)/soft layer (B) in which the two layer differ in point of the storage elastic modulus (E') or the additive blend ratio therein; a two-type three-layer configuration of hard layer/soft layer/hard layer; a three type three-layer configuration of soft layer/adhesive layer/hard layer; a three-type five layer configuration of soft layer/adhesive layer/hard layer/adhesive layer/soft layer, hard layer/adhesive layer/soft layer/adhesive layer/hard layer, soft layer/regenerated layer/hard layer/regenerated layer/ soft layer or soft layer/regenerated layer/hard layer/regenerated layer/hard layer, etc.

Further, in producing sheets, any other substrate film (for example, oriented polyester film (OPET), oriented polypropylene film (OPP), or various types of weather-resistant films such as ETFE (ethylene tetrafluoride-ethylene copolymer), PVF (polyvinyl fluoride), PVDF (polyvinylidene fluoride) or any other acrylic film, etc.) may be laminated on the encapsulant material according to a method of extrusion lamination, coextrusion, sandwich lamination or the like. By laminating the solar cell encapsulant material of the present invention with any other various types of substrate layers, the handleability of the resulting laminate may be enhanced, and the necessary properties and the economic potential of the laminate may be relatively readily controlled.

[Solar Cell Module]

Next, using the solar cell encapsulant material of the present invention, a solar cell module can be produced by fixing a solar cell element with upper and lower protective materials of a front sheet and back sheet. Various types of the solar cell module of the type are exemplified here. As one preferred example, there is mentioned a solar cell module produced by the use of the solar cell encapsulant material of the present invention, an upper protective material, a solar cell element and a lower protective material. Concretely, there are mentioned a configuration of upper protective material/encapsulant material (encapsulant resin layer)/solar cell element/encapsulant material (encapsulant resin layer)/lower protective material, in which the solar cell element is sandwiched between encapsulant materials on both sides thereof (see FIG. 1); a configuration in which an encapsulant material and an upper protective material are formed on the solar cell element formed on the inner peripheral surface of a lower protective material; a configuration where an encapsulant material and a lower protective material are formed on the solar cell element formed on the inner peripheral surface of an upper protective material, such as an amorphous solar cell element formed on a fluororesin-based transparent protective material by sputtering or the like thereon; etc. In the solar cell module using the solar cell encapsulant material of the present invention, in case where the encapsulant material is used in two or more sites, the solar cell encapsulant material of the present invention may be used in all the sites, or the solar cell encapsulant material of the present invention may be used only in one site. In such a case where the encapsulant material is used in two or more sites, the resin composition (C) constituting the solar cell encapsulant material of the present invention to be used in each site may be the same or different.

The solar cell element is arranged between encapsulant resin layers and connected to others by wiring. For example, there are mentioned single-crystal silicon-based, polycrystal silicon-based, amorphous silicon-based, gallium-arsenic, copper-indium-selenium, cadmium-tellurium or the like III-V group or II-VI group compound semiconductor-based, dye-sensitized type, organic thin film-type or the like solar cell elements.

The members to constitute the solar cell module produced by the use of the solar cell encapsulant material of the present invention are not specifically defined. As the upper protective material, for example, there are mentioned single-layer or multi-layer protective materials of plates or films of glass, acrylic resin, polycarbonate, polyester, fluororesin, etc. The lower protective material may be a single-layer or multi-layer sheet including various types of metal or thermoplastic resin films, and for example, there are mentioned a single-layer or multi-layer protective material of an inorganic material such as tin, aluminium, stainless or the like metal or glass, or a polyester, an inorganic substance-deposited polyester, a fluororesin, a polyolefin, etc. The surface of these upper and/or lower protective materials may be surface-treated in any known manner for primer treatment, corona treatment or the like for the purpose of enhancing the adhesiveness thereof to the solar cell encapsulant material of the present invention or to any other members. The main object of using the solar cell encapsulant material of the present invention is for protecting solar cell elements, however, the encapsulant material may also be used in any other site of solar cell modules where it does not adhere to solar cell elements, for the purpose of enhancing the softness of the module or controlling the thickness thereof, or for securing the dielectric breakdown voltage of the module as a whole thereof.

Figure 1:
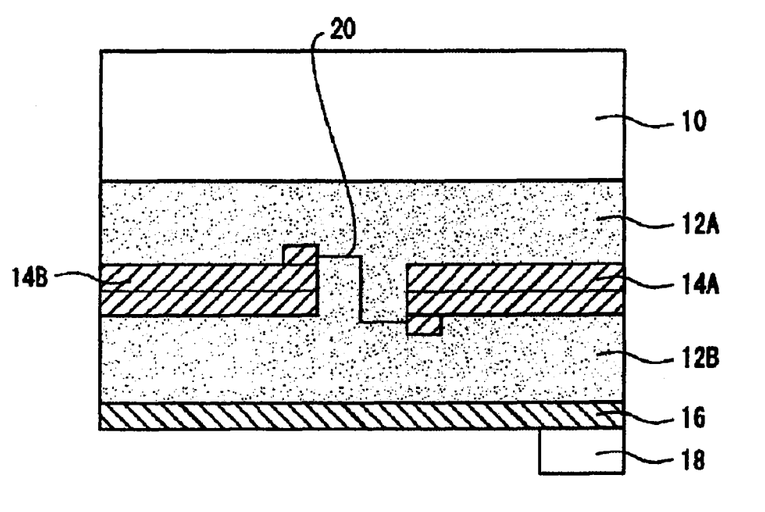
FIG. 1 This is a schematic cross-sectional view showing one example of the solar cell module of the present invention.

One example of the solar cell module produced by the use of the solar cell encapsulant material of the invention as mentioned above, having a configuration of upper protective material/encapsulant material (encapsulant resin layer)/solar cell element/encapsulant material (encapsulant resin layer)/lower protective material where the solar cell element is sandwiched between the encapsulant materials on both sides thereof, is described below. As shown in FIG. 1, a transparent substrate 10, an encapsulant resin layer 12A using the solar cell encapsulant material of the present invention, a solar cell elements 14A and 14B, an encapsulant resin layer 12B using the solar cell encapsulant material of the present invention, and a back sheet 16 are laminated in that order from the side of receiving sunlight, and to the lower surface of the back sheet 16, adhered is a junction box 18 (terminal box for connecting a wiring for taking out the generated electricity from the solar cell element). The solar cell elements 14A and 14B are connected by the wiring 20 for electrically leading the generated current to the outside. The wiring 20 is taken to the outside via the through-hole (not shown) formed in the back sheet 16, and is connected to the junction box 18.

As the production method for the solar cell module, employable is any known method with no specific limitation thereon. In general, the production method comprises a step of laminating an upper protective material, an encapsulant resin layer, a solar cell element, an encapsulant resin layer and a lower protective material in that order, and a step of laminating them under heat and pressure through vacuum suction. A batch-type production line, or a roll-to-roll type production line is applicable to the method.

The solar cell module produced by the use of the solar cell encapsulant material of the present invention is usable in various applications irrespective of indoor use or outdoor use, for example, for small-size solar cells such as typically those in mobile instruments, as well as large-size solar cells to be installed on roofs or rooftop decks, depending on the type of the solar cell and the module form to be applied thereto.

EXAMPLES

The present invention is described in more detail with reference to the following Examples, however, the present invention is not limited at all by these Examples. The sheets mentioned in the specification were analyzed for their data and evaluations, as mentioned below. In this, the sheet running direction from extruder is referred to as a machine direction, and the direction perpendicular to that direction is referred to as a transverse direction.

(1) Crystal Melting Peak Temperature (Tm)

Using Perkin Elmer's differential scanning calorimeter, trade name "Pyrisl DSC" and according to JIS K7121, about 10 mg of a sample was heated from −40° C. to 200° C. at a heating rate of 10° C./min, kept at 200° C. for 1 minute, and then cooled down to −40° C. at a cooling rate of 10° C./min, and again this was heated up to 200° C. at a heating rate of 10° C./min, and on the thermogram thus drawn through the cycle, the crystal melting peak temperature (Tm) (° C.) was read.

(2) Extrapolated Onset Temperature of Melting (Tim)

Using Perkin Elmer's differential scanning calorimeter, trade name "Pyrisl DSC" and according to JIS K7121, about 10 mg of a sample was heated from −40° C. to 200° C. at a heating rate of 10° C./min, kept at 200° C. for 1 minute, and then cooled down to −40° C. at a cooling rate of 10° C./min, and again this was heated up to 200° C. at a heating rate of 10° C./min, and on the thermogram thus drawn through the cycle, the extrapolated onset temperature of melting (° C.) was read.

(3) Heat of Crystal Fusion (ΔHm)

Using Perkin Elmer's differential scanning calorimeter, trade name "Pyrisl DSC" and according to JIS K7122, about 10 mg of a sample was heated from −40° C. to 200° C. at a heating rate of 10° C./min, kept at 200° C. for 1 minute, and then cooled down to −40° C. at a cooling rate of 10° C./min, and again this was heated up to 200° C. at a heating rate of 10° C./min, and on the thermogram thus drawn through the cycle, the heat of crystal fusion (ΔHm) (J/g) was read.

(4) Softness

Using IT Measurement's viscoelasticity meter, trade name "Viscoelasticity Spectrometer DVA-200", a sample (4 mm in length, 60 mm in width) was analyzed in the lateral direction, at a oscillation frequency of 10 Hz, at a strain of 0.1%, at a heating rate of 3° C./min and at a chuck-to-chuck distance of 25 mm, in a range from −150° C. to 150° C., and from the acquired data, the storage elastic modulus (E') (MPa) at 20° C. of the sample was obtained.

(5) Heat Resistance

A sheet-like sample having a thickness of 0.5 mm of an encapsulant material was sandwiched between a white glass board having a thickness of 3 mm (size: 75 mm in length, 25 mm in width) and an aluminium plate having a thickness of 5 mm (size: 120 mm in length, 60 mm in width), and laminated under pressure using a vacuum pressing machine at 150° C. for 15 minutes to produce a laminate sample; the sample is installed in a constant-temperature constant-humidity tank at 85° C. and 85% RH, as inclined by 60 degrees therein; and after 2000 hours, the condition of the laminate sample was checked.

(○) Glass did not shift from the initial standard position.
(x) Glass shifted from the initial standard position or the sheet melted.

Example 1

A resin composition (C) prepared by mixing 95 parts by mass of an ethylene-octene random copolymer (Dow Chemical's trade name: Engage 8200, octene content: 10.1 mol % (31% by mass), MFR (temperature: 190° C., load: 21.18 N): 5, Tm: 65° C., ΔHm: 53 J/g) (hereinafter abbreviated as A-1) as the olefin-based polymer (A), 5 parts by mass of an ethylene-octene block copolymer (Dow Chemical's trade name: Infuse 9000, octene content: 11.9 mol % (35% by mass), MFR (temperature: 190° C., load: 21.18 N): 0.5, extrapolated onset temperature of melting (Tim): 115° C., Tm: 122° C., ΔHm: 44 J/g) (hereinafter abbreviated as B-1) as the olefin-based polymer (B) and 0.5 parts by mass of γ-methacryloxypropyltrimethoxysilane (Shin-etsu Chemical's trade name: KBM503) as a silane coupling agent was melt-kneaded at a preset temperature of from 190 to 200° C. using a 40-mmφ unidirectional double-screw extruder equipped with a T-die, and sheeted on a cast roll at 20° C. in a mode of rapid cooling thereon, thereby giving a sheet-like solar cell encapsulant material having a thickness of 0.5 mm (hereinafter this is simply abbreviated as sheet). The obtained sheet was analyzed and evaluated, and the results are shown in Table 1.

Example 2

A sheet having a thickness of 0.5 mm was obtained in the same manner as in Example 1, except that the resin composition to constitute the sheet was changed as shown in Table 1, or that is, the resin composition was changed to one comprising 80 parts by mass of (A-1), and 20 parts by mass of an ethylene-octene block copolymer (Dow Chemical's trade name: Infuse 9107, octene content: 16.4 mol % (44% by mass), MFR (temperature: 190° C., load: 21.18 N): 1, extrapolated onset temperature of melting (Tim): 114° C., Tm: 119° C., ΔHm: 19 J/g) (hereinafter abbreviated as B-2). The obtained sheet was analyzed and evaluated, and the results are shown in Table 1.

Example 3

A sheet having a thickness of 0.5 mm was obtained in the same manner as in Example 1, except that the resin composition to constitute the sheet was changed as shown in Table 1, or that is, (A-1) therein was changed to a propylene-butene random copolymer (Mitsui Chemical's trade name: TAFMER XM-7070, butene content: 25.2 mol % (31% by mass), MFR (temperature: 230° C., load: 21.18 N): 7, Tm: 79° C., ΔHm: 43 J/g) (hereinafter abbreviated as A-2). The obtained sheet was analyzed and evaluated, and the results are shown in Table 1.

Example 4

The resin composition (containing silane coupling agent) used in Example 1 was used as the soft layer on both surfaces, and the resin composition (not containing silane coupling agent) used in Example 3 was used as the hard layer of interlayer. Using different extruders, these were separately melt-kneaded at a preset temperature of from 190 to 200° C., then co-extruded through a three-layer die, and sheeted on a cast roll at 20° C. in a mode of rapid cooling thereon, thereby giving a two-type three-layer solar cell encapsulant material sheet having a thickness of 0.5 mm (soft layer/hard layer/soft layer=0.125 mm/0.25 mm/0.125 mm). Having the laminate configuration, the handleability of the sheet was bettered as a whole though the surface layers (soft layers) were soft. The obtained sheet was analyzed and evaluated, and the results are shown in Table 1.

Example 5

Using a vacuum laminator (NPC's trade name: LM30×30), five layers of a white glass board having a thickness of 3 mm (Asahi Glass's trade name: Solite) as the upper protective material, the sheet having a thickness of 0.5 mm produced in Example 1 (encapsulant material), a solar cell element (simply referred to as cell) having a thickness of 0.4 mm (Photowatt's Model 101×101MM), the sheet having a thickness of 0.5 mm produced in Example 1 (encapsulant material), and a weather-resistant PET film having a thickness of 0.125 mm (Toray's Lumirror X10S) as the lower protective material were, as laminated in that order from the hot plate side, pressed in vacuum at a hot plate temperature of 150° C. and for a processing time of 20 minutes (breakdown, vacuuming: 5 minutes, pressing: 5 minutes, pressure keeping: 10 minutes), under a rapid pressure-lamination speed condition, thereby producing a solar cell module (size: 150 mm×150 mm). The obtained solar cell module was excellent in transparency and appearance.

Comparative Example 1

A sheet having a thickness of 0.5 mm was obtained in the same manner as in Example 1, except that the resin composition to constitute the sheet was changed as in Table 1, or that is, 100 parts by mass of (A-1) was used not using (B-1). The obtained sheet was analyzed and evaluated, and the results are shown in Table 1.

Comparative Example 2

A sheet having a thickness of 0.5 mm was obtained in the same manner as in Example 1, except that the resin composition to constitute the sheet was changed as in Table 1, or that is, (B-1) therein was changed to a propylene-butene random copolymer (Mitsui Chemical's trade name: TAFMER XR110T, butene content: 24.3 mol % (30% by mass), MFR (temperature: 230° C., load: 21.18 N): 6, extrapolated onset temperature of melting (Tim): 97° C., Tm: 112° C., ΔHm: 31 J/g) (hereinafter abbreviated as P-1). The obtained sheet was analyzed and evaluated, and the results are shown in Table 1.

Comparative Example 3

A sheet having a thickness of 0.5 mm was obtained in the same manner as in Example 2, except that the resin composition to constitute the sheet was changed as in Table 1, or that is, (B-1) therein was changed to (P-1) used in Comparative Example 1. The obtained sheet was analyzed and evaluated, and the results are shown in Table 1.

TABLE 1

| olefin-based Polymer (part by mass) | | Tm (° C.) | Tim (° C.) | Example | | | | Comparative Example | | |
|---|---|---|---|---|---|---|---|---|---|---|
| | | | | 1 | 2 | 3 | 4 | 1 | 2 | 3 |
| (A) | A-1 | 65 | — | 95 | 80 | | (two-type three-layer) | 100 | 95 | 80 |
| | A-2 | 79 | — | | | 95 | | | | |
| (B) | B-1 | 122 | 115 | 5 | | 5 | | | | |
| | B-2 | 119 | 114 | | 20 | | | | | |
| — | P-1 | 112 | 97 | | | | | | 5 | 20 |
| Tim(B)-Tm(A) (° C.) | | | | 50 | 49 | 36 | | — | 32 | 32 |
| Storage Elastic Modulus (E') (MPa) | | | | 12 | 16 | 263 | 140 | 12 | 16 | 25 |
| Heat Resistance | | | | ○ | ○ | ○ | ○ | X | X | X |

From Table 1, it is confirmed that the solar cell encapsulant materials comprising the resin composition as defined in the present invention do not require a crosslinking process and are excellent in heat resistance (Examples 1 to 4). In addition, it is also confirmed that those given heat resistance by the ethylene-octene block copolymer are excellent in softness (Example 1, Example 2). Next, it is confirmed that, by employing a laminate configuration, the surface properties and the properties as a whole of the encapsulant material (handleability, etc.) can be controlled (Example 4). Further, it is confirmed that, when the solar cell encapsulant material comprising the resin composition defined in the present invention is used, then it is easy to produce a solar cell module (Example 5). As opposed to these, it is confirmed that the compositions not containing the olefin-based polymer (B) defined in the present invention are insufficient in heat resistance though the crystal melting peak temperature thereof is 110° C. or more (Comparative Examples 1 to 3).

DESCRIPTION OF REFERENCE NUMERALS AND SIGNS

10 Transparent Substrate
12A, 12B Encapsulant Resin Layer
14A, 14B Solar Cell Element
16 Back Sheet
18 Junction Box
20 Wiring

The invention claimed is:

1. A solar cell encapsulant material comprising a resin composition comprising a first olefin-based polymer and a second olefin-based polymer,
   wherein a crystal melting peak temperature of the first olefin-based polymer, as measured at a heating rate of 10° C./min in differential scanning calorimetry, is from 30 to 95° C.;
   an extrapolated onset temperature of melting of the second olefin-based polymer, as measured at a heating rate of 10° C./min in differential scanning calorimetry, is 100 to 130° C.
   a difference between the crystal melting peak temperature of the first olefin-based polymer and the extrapolated onset temperature of melting of the second olefin-based polymer is 35° C. or higher; and
   wherein a ratio by mass of the first olefin-based polymer to the second olefin-based polymer in the resin composition is in a range of 99:1 to 50:50,
   wherein the first olefin-based polymer is an α-olefin random copolymer that comprises units of an α-olefin and units of a monomer other than the α-olefin, and
   wherein a content of units from the α-olefin in the α-olefin random copolymer is from 2 to 40 mol %, relative to the total monomer units in the α-olefin random copolymer.

2. The solar cell encapsulant material according to claim 1, wherein the second olefin-based polymer is an ethylene-α-olefin block copolymer.

3. The solar cell encapsulant material according to claim 1, wherein the resin composition further comprises at least one additive selected from the group consisting of a silane coupling agent, an antioxidant, a UV absorbent, and a weather-resistant stabilizer.

4. The solar cell encapsulant material according to claim 1, wherein the solar cell encapsulant material has a laminate configuration.

5. The solar cell encapsulant material according to claim 4, wherein the laminate configuration comprises at least two layers, wherein at least two of the layers differ from each other in a storage elastic modulus in dynamic viscoelasticity measurement at an oscillation frequency of 10 Hz and at a temperature of 20° C.

6. The solar cell encapsulant material according to claim 5, wherein the layers that differ from each other in the storage elastic modulus comprise a first layer and a second layer,
wherein the storage elastic modulus of the first layer is less than 100 MPa; and
the storage elastic modulus of the second layer is 100 MPa or higher.

7. The solar cell encapsulant material according to claim 6, wherein the laminate configuration of the at least two layers is a two-type three-layer configuration of the first layer/the second layer/the first layer.

8. The solar cell encapsulant material of claim 6, wherein the storage elastic modulus of the first layer is from 5 to 50 MPa and the storage elastic modulus of the second layer is from 200 to 800 MPa.

9. A solar cell module comprising the solar cell encapsulant material of claim 1.

10. The solar cell encapsulant material of claim 1,
wherein the units of the α-olefin in the α-olefin random copolymer are units of an α-olefin selected from the group consisting of propylene, 1-butene, 1-pentene, 1-hexene, 1-heptene, 1-octene, 1-nonene, 1-decene, 3-methyl-butene-1, 4-methyl-pentene-1, and a combination thereof.

11. The solar cell encapsulant material of claim 10,
wherein the units of the α-olefin in the α-olefin random copolymer are units of an α-olefin selected from the group consisting of propylene, 1-butene, 1-hexene 1-octene, and a combination thereof.

12. The solar cell encapsulant material of claim 1,
wherein a content of units from the α-olefin in the α-olefin random copolymer is from 3 to 30 mol %, relative to the total monomer units in the α-olefin random copolymer.

13. The solar cell encapsulant material of claim 1,
wherein a content of units from the α-olefin in the α-olefin random copolymer is from 5 to 25 mol %, relative to the total monomer units in the α-olefin random copolymer.

14. A solar cell encapsulant material comprising a resin composition comprising a first olefin-based polymer and a second olefin-based polymer,
wherein a crystal melting peak temperature of the first olefin-based polymer, as measured at a heating rate of 10° C./min in differential scanning calorimetry, is from 30 to 95° C.;
an extrapolated onset temperature of melting of the second olefin-based polymer, as measured at a heating rate of 10° C./min in differential scanning calorimetry, is 100 to 130° C.
a difference between the crystal melting peak temperature of the first olefin-based polymer and the extrapolated onset temperature of melting of the second olefin-based polymer is 35° C. or higher; and
wherein a ratio by mass of the first olefin-based polymer to the second olefin-based polymer in the resin composition is in a range of 99:1 to 50:50,
wherein the second olefin-based polymer is an ethylene-octene multi-block copolymer.

* * * * *